(12) United States Patent
Kitano et al.

(10) Patent No.: US 8,848,386 B2
(45) Date of Patent: Sep. 30, 2014

(54) ELECTRONIC CIRCUIT (75) Inventors: Naofumi Kitano, Osaka (JP); Toshiro Nishimura, Osaka (JP)

(73) Assignee: Panasonic Corporation, Osaka (JP)

( * ) Notice: Subject to any disclaimer, the term of this patent is extended or adjusted under 35 U.S.C. 154(b) by 200 days.

(21) Appl. No.: 13/272,837

(22) Filed: Oct. 13, 2011

(65) Prior Publication Data
US 2012/0092843 A1 Apr. 19, 2012

(30) Foreign Application Priority Data

Oct. 14, 2010 (JP) ................. 2010-231663

(51) Int. Cl.
*H05K 1/18* (2006.01)
*H05K 1/11* (2006.01)
*H05K 1/02* (2006.01)

(52) U.S. Cl.
CPC .... *H05K 1/0231* (2013.01); *H05K 2201/10545* (2013.01); *H05K 2201/0979* (2013.01); *H05K 1/113* (2013.01)
USPC .......................................................... 361/763

(58) Field of Classification Search
USPC ........................... 361/763, 761, 764; 257/691
See application file for complete search history.

(56) References Cited

U.S. PATENT DOCUMENTS 6,534,723 B1 3/2003 Asai et al.

FOREIGN PATENT DOCUMENTS

| JP | 2001-217550 | | 8/2001 |
|---|---|---|---|
| JP | 2003-297963 | | 10/2003 |
| JP | 2007-305642 | | 11/2007 |
| JP | 2007305642 A | * | 11/2007 |
| JP | 2009-170941 | | 7/2009 |

* cited by examiner

*Primary Examiner* — Andargie M Aychillhum
(74) *Attorney, Agent, or Firm* — Hamre, Schumann, Mueller & Larson, P.C.

(57) ABSTRACT

In order to keep impedance characteristics to desired values across the entire operating frequency band, an electronic circuit of the present invention includes an integrated circuit, a decoupling capacitor, and a multilayer circuit board on which the integrated circuit and the decoupling capacitor are mounted. In the electronic circuit, a planar land is formed on one or both of a power layer and a ground layer of the multilayer circuit board, the land having densely disposed therein a plurality of via holes that connect a terminal of the integrated circuit and a corresponding terminal of the decoupling capacitor, and the land formed on the power layer or the ground layer is discontinuously disposed at a predetermined interval with a gap having a predetermined width provided therebetween.

2 Claims, 6 Drawing Sheets

ELECTRONIC CIRCUIT

BACKGROUND OF THE INVENTION

1. Field of the Invention

The present invention relates to an electronic circuit on which an integrated circuit and a decoupling capacitor for stably operating the integrated circuit are mounted on a multilayer circuit board, and particularly relates to an electronic circuit in which an impedance value of the decoupling capacitor in a wide frequency band is reduced.

2. Description of Related Art

Various integrated circuits (such as ICs and LSIs) including various functions of a microcomputer, a logic circuit or the like are used as key components of various electronic and information devices. Since an integrated circuit malfunctions unless a current is instantaneously supplied thereto in an operating frequency band, a decoupling capacitor connected between an operation power-supply potential and a ground of the integrated circuit is disposed around the integrated circuit.

In recent years, the operating frequency band of integrated circuits has been widened, but the frequency band that a single decoupling capacitor having a fixed capacitance value is able to can compensate is limited. Therefore, in order to compensate the operation of a single integrated circuit in a wideband operating frequency, multiple decoupling capacitors are necessary. In addition, in recent years, the supply current required by the integrated circuits has been steadily increasing, and the higher the load on the integrated circuit, the larger the number of required decoupling capacitors.

In order to dispose a large number of decoupling capacitors to cope with an increase in the number of decoupling capacitors required for a single integrated circuit, and also in order to cope with an increase in the number of pins due to the increased functions of integrated circuits themselves, a multilayer circuit board formed by laminating a plurality of layers on a single substrate is used as a circuit board for mounting an integrated circuit.

A multilayer circuit board is formed by laminating a plurality of insulating hard substrates, on each of which a conductor wiring pattern is formed on one or both surfaces, and integrating the insulating hard substrates by heat pressing. By filling the inside of via holes formed by penetrating the insulating hard substrates with a conductive material, electrical connection is established between predetermined terminals on different layers. By combining this inter-layer connection established by the via holes and connection by wiring patterns disposed on the surface of the substrates, numerous electrical wirings can be disposed in a small area. Such a multilayer circuit board is disclosed in, for example, JP 2001-217550A, and JP 2007-305642A.

In an electronic circuit that uses a multilayer circuit board and on which an integrated circuit is mounted, the integrated circuit formed on one of the main surfaces of the multilayer circuit board is connected to a decoupling capacitor disposed on the same main surface or the opposite main surface through wiring patterns formed on the layers and via holes connecting the layers.

In the case where an integrated circuit and a decoupling capacitor are mounted on a multilayer circuit board, in order to set the effective capacitance value of the decoupling capacitor to a desirable value, it is required to suppress a resistance component of the wiring patterns and via holes of the multilayer circuit board which are interposed between the terminals of the decoupling capacitor and the integrated circuit as much as possible. For this purpose, the decoupling capacitor is disposed in a position that is physically close to the integrated circuit, thereby reducing the length of the current flow path. Also, the thickness of the wiring patterns on the layers of the multilayer circuit board is increased, the area of an isolated pattern called a land formed by connecting portions having the same potential is increased, or as large a number of via holes as possible are used between a pair of terminals for establishing electrical connection between substrates, thereby reducing the electrical resistance value in connecting wiring portions.

However, in order to cope with high current driving that has accompanied the recent improved performance of integrated circuits, at present a sufficient level has not yet reached in terms of shortening the current flow path or reducing resistance.

SUMMARY OF THE INVENTION

The present invention solves the problems of conventional techniques described above, and aims to obtain, with respect to electronic circuits in which an integrated circuit that has a wide operating frequency and is driven at a high current and decoupling capacitors for stably operating the integrated circuit are mounted on a multilayer circuit board, an electronic circuit that can keep impedance characteristics to desired values across the entire operating frequency band.

In order to solve the above-described problem, an electronic circuit of the present invention is an electronic circuit including an integrated circuit, a decoupling capacitor, and a multilayer circuit board on which the integrated circuit and the decoupling capacitor are mounted, in which a planar land is formed on one or both of a power layer and a ground layer of the multilayer circuit board. The land has densely disposed therein a plurality of via holes that connect a terminal of the integrated circuit and a corresponding terminal of the decoupling capacitor, and the land formed on the power layer or the ground layer is discontinuously disposed at a predetermined interval with a gap having a predetermined width provided therebetween.

In the electronic circuit of the present invention, lands formed by via holes for connecting layers of the multilayer circuit board are discontinuously disposed, and thus a gap portion between the lands serves as a flow path for a return current. Therefore, frequency characteristics (ESL and ESR) of the decoupling capacitor can be approximated to the original frequency characteristic values. As a result, it is possible to set impedance characteristics to a desired value across the entire operating frequency band of the integrated circuit.

DETAILED DESCRIPTION OF THE INVENTION

An electronic circuit disclosed in the present invention is an electronic circuit including an integrated circuit, a decoupling capacitor, and a multilayer circuit board on which the integrated circuit and the decoupling capacitor are mounted, in which a planar land is formed on one or both of a power layer and a ground layer of the multilayer circuit board. The land has densely disposed therein a plurality of via holes that connect a terminal of the integrated circuit and a corresponding terminal of the decoupling capacitor, and the land formed on the power layer or the ground layer is discontinuously disposed at a predetermined interval with a gap having a predetermined width provided therebetween.

In this manner, lands formed by via holes for connecting layers of the multilayer circuit board are disposed discontinuously at a predetermined interval on one or both of a power layer and a ground layer, with a predetermined gap provided between the lands, and thus the gap portion between the lands serves as a flow path of a return current on the power layer or the ground layer. Therefore, a resistance value between a terminal of the integrated circuit and a terminal of a decoupling capacitor is prevented from increasing, so that frequency characteristics (ESL and ESR) of the decoupling capacitor can be approximated to their original value. As a result, it is possible to set impedance characteristics of the integrated circuit to a desired value across the entire operating frequency band of the integrated circuit.

In the above-described electronic circuit, it is preferable that the land is disposed discontinuously for each terminal of the decoupling capacitor to which the land corresponds, with the predetermined gap provided therebetween. In this manner, it is possible to secure the flow path of the return current in each decoupling capacitor in close proximity to the lands formed by via holes.

Also, a configuration may be adopted in which the decoupling capacitor is disposed on a main surface of the multilayer circuit board, the main surface being an opposite main surface that is different from a main surface on which the integrated circuit is mounted.

Furthermore, a configuration may be adopted in which the decoupling capacitor is disposed on a main surface of the multilayer circuit board, the main surface being a main surface on which the integrated circuit is mounted.

Hereinafter, specific embodiments of an electronic circuit disclosed in the present invention will be described with reference to the attached drawings.

Note that, for the sake of description, in the drawings referred to in the description given below, only main members that are necessary for describing the electronic circuit disclosed in the present invention, out of the constituent members of the electronic circuit disclosed in the present invention, are shown, in a simple manner. Accordingly, the electronic circuit disclosed in the present invention may include constituent members that are not shown in the referenced drawings. In addition, the dimensions of the members in the drawings do not always faithfully reflect actual dimensions, dimensional ratios or the like of the constituent members.

Figure 1:
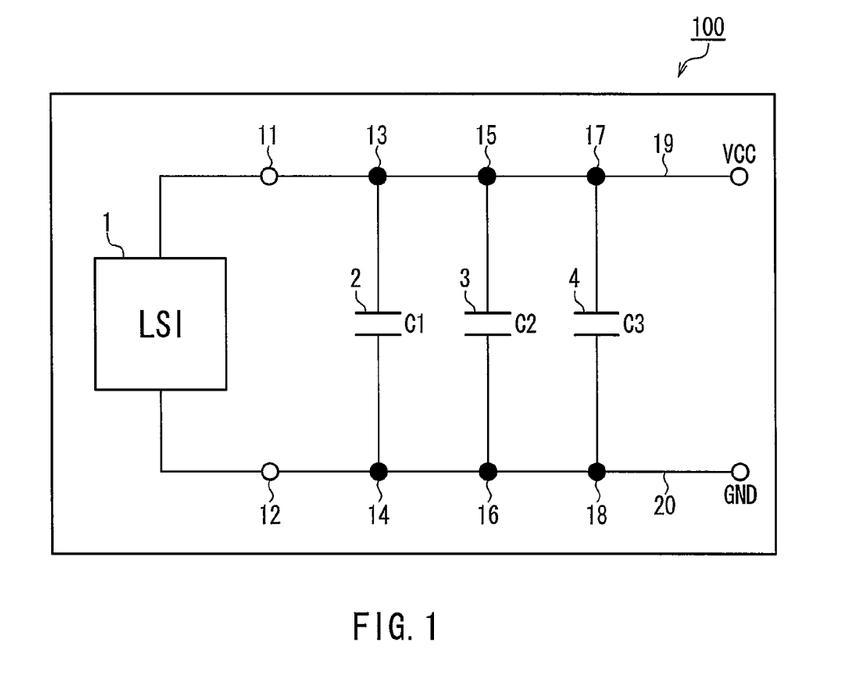
FIG. 1 is a schematic circuit configuration diagram illustrating a state of connection between an integrated circuit and decoupling capacitors in an electronic circuit according to an embodiment.

FIG. 1 is a schematic circuit configuration diagram illustrating a state of connection of an electronic circuit according to the present embodiment in which an integrated circuit and decoupling capacitors are mounted on a multilayer circuit board.

As shown in FIG. 1, an electronic circuit 100 of the present embodiment includes an LSI serving as an integrated circuit 1, and a first decoupling capacitor (C1) 2, a second decoupling capacitor (C2) 3, and a third decoupling capacitor (C3) 4 that are connected in parallel between an operation power-supply potential (VCC) line 19 and a ground (GND) line 20 of the integrated circuit 1.

Note that in the circuit diagram shown in FIG. 1, a power supply side connection terminal 11 of the integrated circuit 1 and power supply side connection terminals 13, 15, and 17 of the first decoupling capacitor 2, the second decoupling capacitor 3 and the third decoupling capacitor 4 are depicted as being connected to the same operation power-supply potential line 19, and a ground side connection terminal 12 of the integrated circuit 1 land ground side connection terminals 14, 16, and 18 of the first decoupling capacitor 2, the second decoupling capacitor 3 and the third decoupling capacitor 4 are depicted as being connected to the same ground line 20. However, in actual fact, a terminal of the first decoupling capacitor 2, which has a particularly small capacitance and size, may be connected between a power-supply potential terminal and a ground terminal that are provided in the integrated circuit 1 for connection to the respective decoupling capacitors. For this reason, the first decoupling capacitor 2 having the particularly small capacitance and size is often allocated a position near an LSI terminal.

The first decoupling capacitor (C1) 2 handles a high operating frequency, and is a ceramic capacitor having a small capacitance, for example. The second decoupling capacitor (C2) 3 handles an intermediate operating frequency, and is a ceramic capacitor having a capacitance larger than that of the first decoupling capacitor (C1) 2, for example. The third decoupling capacitor (C3) 4 handles a low operating frequency, and is a bulk capacitor having a capacitance larger than that of the second decoupling capacitor (C2) 3, for example. Specific sizes and capacitances of these decoupling capacitors 2, 3 and 4 are, for example, as follows. That is, the first decoupling capacitor (C1) 2 has a size of 1.0 mm×0.5 mm and a capacitance of 1.0 µF, the second decoupling capacitor (C2) 3 has a size of 2.0 mm×1.2 mm and a capacitance of 22 µF, and the third decoupling capacitor (C3) 4 has a size of 7 mm×4 mm and a capacitance of 470µF.

In this manner, in the electronic circuit of the present embodiment, by disposing decoupling capacitors having different capacitance values corresponding to the operating frequency of the LSI, it is possible to remove noise components in input potential in a wide range from a low operating frequency to a high operating frequency, and thereby achieve stable operation of the LSI. Note that as schematically illustrated in FIG. 1, a decoupling capacitor having the smallest capacitance and size should be disposed in a position closest to the LSI. Also, in FIG. 1, an example is shown in which decoupling capacitors having three different capacitance values are used as described above, but this is not essential to the electronic circuit of the present embodiment. Decoupling capacitors having two, or four or more different capacitance values may be used.

In addition, in FIG. 1, one each of the decoupling capacitors 2, 3 and 4 that handles the respective operating frequency bands are shown. However, in actual fact, a plurality of decoupling capacitors are connected for each of the different capacitances.

Figure 2:
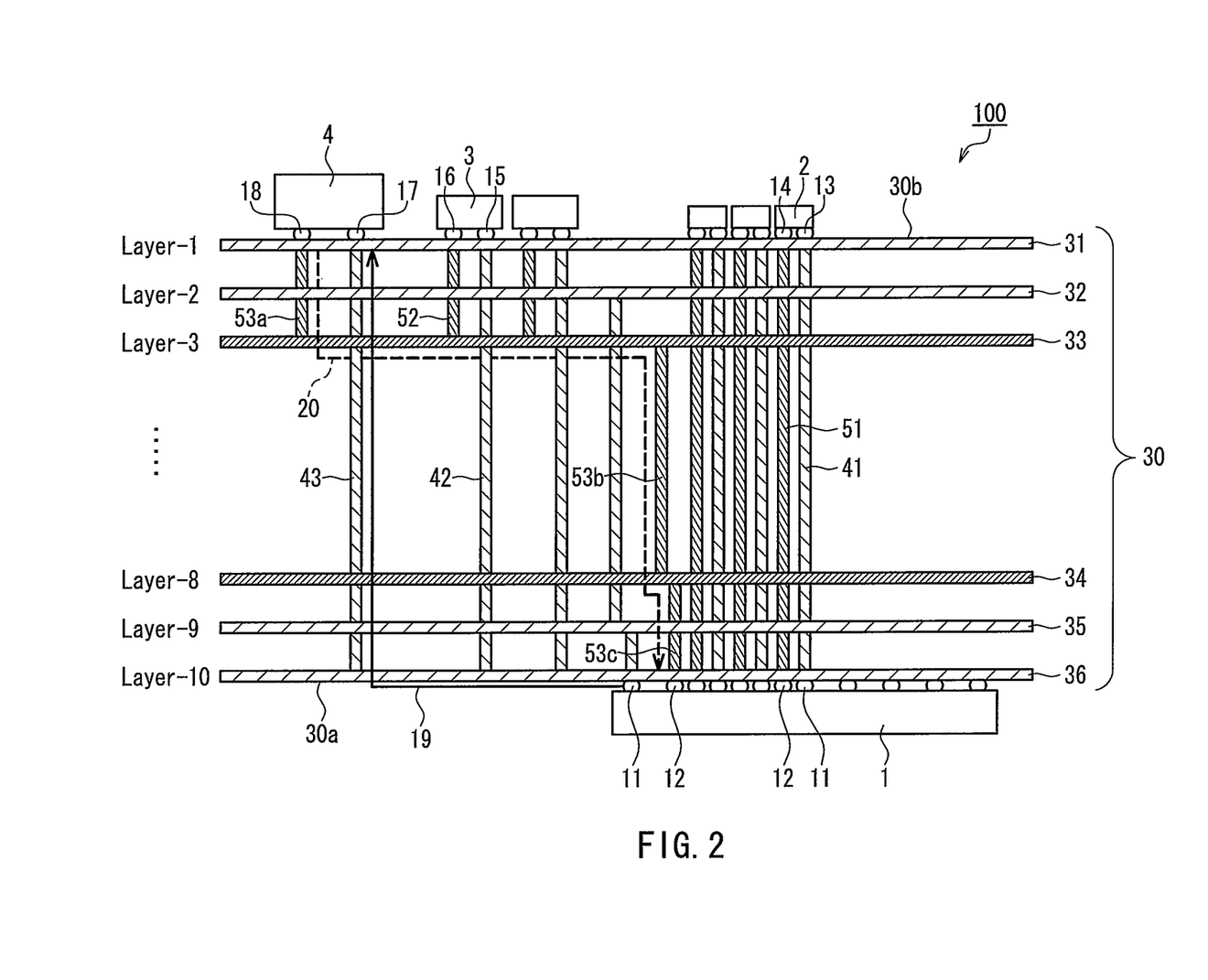
FIG. 2 is a cross-sectional circuit layout diagram illustrating a state of wiring connections in a multilayer circuit board of the electronic circuit according to the embodiment.

FIG. 2 is a schematic diagram illustrating a state of wiring connection in a multilayer circuit board of the electronic circuit of the present embodiment.

As shown in FIG. 2, a multilayer circuit board 30 constituting the electronic circuit 100 of the present embodiment has a ten-layer structure including layers 1 to 10. The two layers closest to each of the main surfaces of the circuit board, namely, a layer-1 (31) and a layer-2 (32) that are close to the upper main surface in FIG. 2, and a layer-9 (35) and a layer-10 (36) that are close to the lower main surface in FIG. 2, correspond to power layers on each of which the operation power-supply potential (VCC) is routed using wiring on the layer. Also, the layer immediately inside the power layers 31 and 32, namely, a layer-3 (33) that is the third layer from an upper main surface 30b in FIG. 2, and the layer immediately inside the power layers 35 and 36, namely, a layer-8 (34) that is the third layer from a lower main surface 30a in FIG. 2, are ground layers, the entirety of each of which is basically at the ground potential (0V). Note that although not shown in FIG. 2, for example, with respect to the four layers in an intermediate portion excluding the above three layers from each main surface, namely, layers-4, 5, 6 and 7, the layer-4 and the layer-7 each serve as a signal wiring layer on which a signal wiring or the like is routed in the horizontal direction, and the layer-5 and the layer-6 each serve as a layer for supplying power to each device.

As shown in FIG. 2, in the electronic circuit 100 of the present embodiment, the integrated circuit 1 is flip-chip connected on one main surface of the multilayer circuit board 30, that is, on the main surface 30a on the layer-10 side, which is on the lower side in FIG. 2. Also, the decoupling capacitors 2, 3 and 4 are mounted on the opposite main surface that is different from the main surface on which the integrated circuit 1 is mounted, that is, on the main surface 30b on the layer-1 side, which is on the upper side in FIG. 2. Therefore, current flow paths are formed through which the power supply side connection terminal 11 of the integrated circuit 1 is connected to the power supply side connection terminals 13, 15, and 17 of the decoupling capacitors 2, 3 and 4, and the ground side connection terminal 12 of the integrated circuit 1 is connected to the ground side connection terminals 14, 16, and 18 of the decoupling capacitors 2, 3 and 4, through the multilayer circuit board 30.

Specifically, the first decoupling capacitors 2 having a small capacitance and size for handling a high operating frequency are disposed in positions on the main surface 30b on the layer-1 side that correspond to the underside of the portion on which the integrated circuit 1 is disposed, in order to shorten the physical distance of the wiring path to the integrated circuit 1. The power supply side connection terminals 13 of the first decoupling capacitors 2 are connected to the power supply side connection terminals 11 of the integrated circuit 1 through vias 41 that pass straight through the multilayer circuit board 30 in the thickness direction thereof. Also, the ground side connection terminals 14 of the first decoupling capacitors 2 are connected to the ground side connection terminals 12 of the integrated circuit 1 through vias 51 that pass straight through the multilayer circuit board 30.

The second decoupling capacitors 3 that handle an intermediate operating frequency are disposed in positions on the main surface 30b on the layer-1 side that are slightly separated from the underside portion the integrated circuit 1. The power supply side connection terminals 15 of the second decoupling capacitors 3 are connected to the power supply side connection terminals 11 of the integrated circuit 1 through vias 42 provided in the multilayer circuit board 30. Also, the ground side connection terminals 16 of the second decoupling capacitors 3 are connected to the ground side connection terminals 12 of the integrated circuit 1 through a via 52.

The third decoupling capacitor 4 that handles a low operating frequency is disposed in a position on the main surface 30b on the layer-1 side that is further separated from the underside portion of the integrated circuit 1. The power supply side connection terminal 17 of the third decoupling capacitor 4 is connected to the power supply side connection terminals 11 of the integrated circuit 1 through a via 43 provided in the multilayer circuit board 30. The current flow path is indicated by a solid line in FIG. 2, as the operation power-supply line 19. Also, the ground side connection terminal 18 of the third decoupling capacitor 4 is connected to the ground side connection terminals 12 of the integrated circuit 1 through vias 53a, 53b and 53c. This current flow path on the return side is indicated by a dotted line in FIG. 2 as the ground line 20.

In this manner, in the multilayer circuit board 30 constituting the electronic circuit of the present embodiment, the power layers 31 and 32 are disposed in a position close to the main surface 30a, and the power layers 35 and 36 are disposed in a position close to the main surface 30b. The ground layer 33 is disposed immediately inside the power layers 31 and 32, and the ground layer 34 is disposed immediately inside the power layers 35 and 36. Therefore, the current flow paths that connect the ground terminals of the integrated circuit 1 to the ground terminals of the decoupling capacitors 3 and 4 disposed in positions separated from the integrated circuit 1 in the horizontal direction are routed in the horizontal direction on the ground layers 33 and 34.

Figure 3:
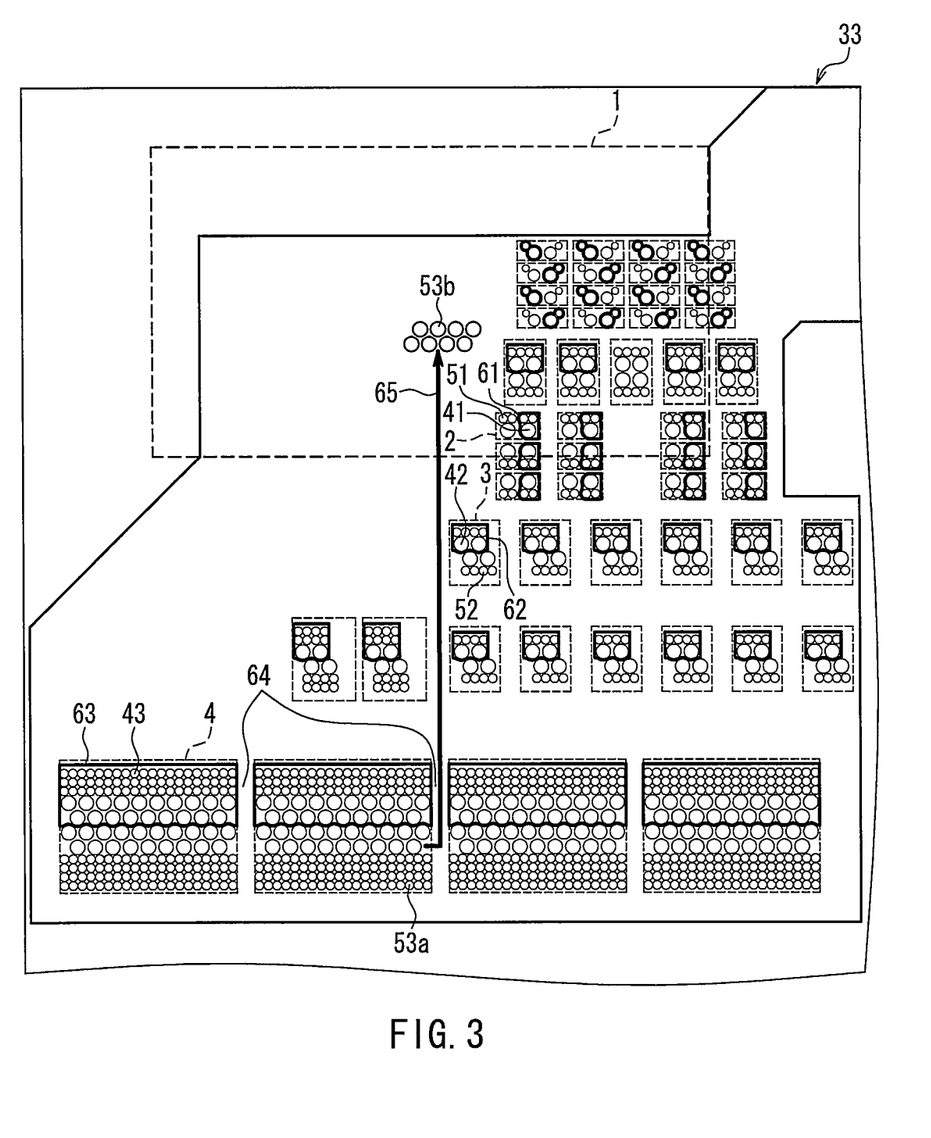
FIG. 3 is an enlarged plan view of a main portion illustrating a land pattern of a ground layer in the electronic circuit according to the embodiment.

FIG. 3 is an enlarged plan view of a main portion illustrating a land pattern of the layer-3 (33) serving as a ground layer.

As shown in FIG. 3, a large number of vias are formed in the layer-3 (33) serving as a ground layer, the vias being indicated by small circles in FIG. 3, and vias connected to the same terminal of the decoupling capacitor form a land.

In a portion in the layer-3 (33) overlapping the position where the integrated circuit 1 is disposed on the layer-10, a plurality of vias 41 of the operation power-supply line connected to the power supply side connection terminals of the first decoupling capacitors 2, which are disposed on the layer-1 and have a small capacitance and size, and a plurality of vias 51 of the ground line connected to the ground side connection terminals of the first decoupling capacitors 2 are formed. A plurality of vias 41 of the operation power-supply line connected to the same power supply side connection terminal of a decoupling capacitor 2 are grouped to form a land 61, so that a wiring resistance component does not occur.

In a portion slightly separated in the horizontal direction from the integrated circuit 1 disposed on the layer-10, a plurality of vias 42 of the operation power-supply line connected to the power supply side connection terminals of the second decoupling capacitor 3, which is disposed on the layer-1 and has an intermediate capacitance, and a plurality of vias 52 of the ground line connected to the ground side connection terminals of the second decoupling capacitor 3 are formed. A plurality of vias 42 of the operation power-supply line connected to the same power supply side connection terminal of a decoupling capacitor 3 also are grouped to form a land 62, thereby taking steps to reduce the wiring resistance component as much as possible.

In a position further separated in the horizontal direction from the position of the integrated circuit 1 disposed on the layer-10, a plurality of vias 43 of the operation power-supply line connected to the power supply side connection terminals of the third decoupling capacitors 4, which are disposed on the layer-1 and have a large capacitance, and a plurality of vias 53a of the ground line connected to the ground side connection terminals of the third decoupling capacitors 4 are formed. A plurality of vias 43 of the operation power-supply line connected to the same power supply side connection terminal of a decoupling capacitor 4 also are grouped to form a land 63, thereby taking steps to reduce the wiring resistance component as much as possible.

Note that since the layer-3 (33) shown in FIG. 3 is a ground layer, portions around the lands 61, 62 and 63 formed by the vias 41, 42 and 43 respectively connected to the power supply side connection terminals of the decoupling capacitors 2, 3 and 4 are integrated as a planar pattern, and the planar pattern portion has a ground potential.

As shown in FIG. 3, in the electronic circuit of the present embodiment, each of the lands 61, 62 and 63, which are formed on the layer-3 (33) serving as a ground layer and form a part of the operation power-supply line, has a shape corresponding to the power supply side connection terminal of the corresponding decoupling capacitor (one of the decoupling capacitors 2, 3 and 4). That is, the respective lands 61, 62 and 63 of the operation power-supply line are each disposed discontinuously at a predetermined interval that corresponds to the size of the power supply side connection terminal of the corresponding decoupling capacitor (one of the decoupling capacitors 2, 3 and 4), with a gap that has a predetermined width corresponding to the interval between the corresponding decoupling capacitors provided between the lands.

In this manner, in particular, a current flow path 65 can pass through a gap portion 64 between the lands 63 forming the operation power-supply line, the current flow path 65 connecting the vias 53a between the layer-1 and the layer-3 of the ground line of the third decoupling capacitor 4 that is disposed in a position separated in the horizontal direction from the disposition position of the integrated circuit 1, and the vias 53b connecting between the layer-3 and the layer-8 that are formed in a position near the portion where the integrated circuit 1 is disposed. Therefore, the length of the current flow path 65 will not be unnecessarily long. For this reason, in the ground line 20 that connects the ground side connection terminals of the third decoupling capacitors 4 and the ground side connection terminals of the integrated circuit 1, an influence exerted by the resistance component of the pattern on the ground layer 33 can be reduced.

Figure 4:
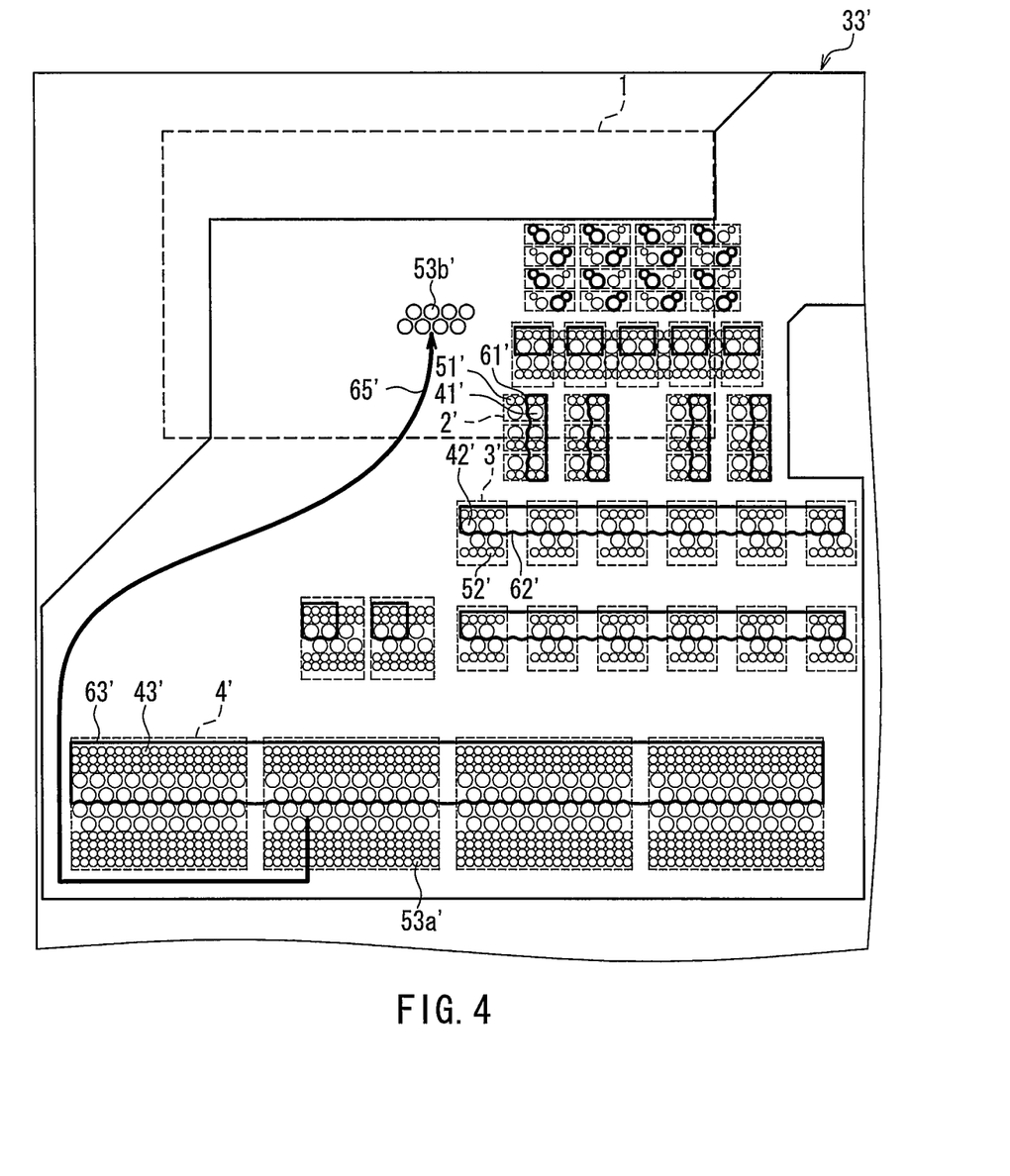
FIG. 4 is an enlarged plan view of a main portion illustrating a land pattern of a ground layer in an electronic circuit of a comparative example.

FIG. 4 illustrates a layout of lands on a ground layer 33' in an electronic circuit serving as a comparative example. FIG. 4 is a diagram corresponding to FIG. 3, which illustrates a layout of the lands on the ground layer 33 of the multilayer circuit board 30 of the present embodiment.

In the ground layer 33' of a multilayer circuit board 30' of the comparative example shown in FIG. 4, based on conventional technical ideas, each of lands 61', 62' and 63', which are respectively formed by vias 41', 42' and 43' that form the operation power-supply line, is formed continuously by straddling the respective terminals of the different decoupling capacitors 2', 3' and 4'. In the multilayer circuit board 30' of the comparative example showing the ground layer 33' in FIG. 4, the integrated circuit mounted thereon, the number and capacitance value of the decoupling capacitors, the wiring pattern and the position and size of vias on each layer of the multilayer circuit board, and the like are the same as those of the multilayer circuit board 30 of the present embodiment, other than the point that the lands where the vias of the operation power-supply line are connected are formed continuously.

As confirmed by the inventors, in a method in which as many vias as possible are formed in order to reduce the resistance component in the current flow path of the operation power-supply line, and lands each of which is formed by a group of vias, are formed on layers other than power layers constituting the multilayer circuit board, it is found that when the vias reach a certain number or larger, the impedance of the decoupling capacitor cannot be reduced. The reason for this is considered to be as follows. As with the comparative example shown in FIG. 4, a land is formed in which vias for supplying the power-supply potential to the decoupling capacitors of the same size are integrated as a single portion, and consequently, although the resistance component as the operation power-supply line can be reduced, a ground line 65' that connects the vias 53a' and the vias 53b' forming a return current flow path is required to be routed around the vias 43' of the operation power-supply line on the ground layer. Thus the resistance value corresponding to the portion of the flow path for deviating around the vias 43' is added to the ground line.

Figure 5:
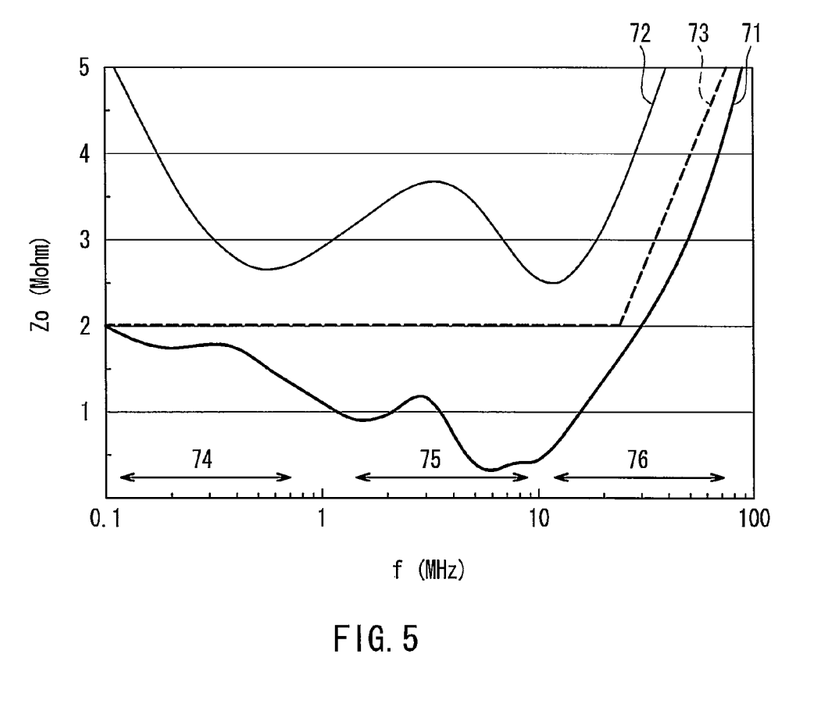
FIG. 5 is a diagram illustrating impedance characteristics of the electronic circuit according to the embodiment and the electronic circuit of the comparative example.

FIG. 5 shows a comparison between impedance characteristics of the decoupling capacitors in the multilayer circuit board 30 of the present embodiment shown in FIG. 3 and impedance characteristics of the decoupling capacitors in the multilayer circuit board 30' of the comparative example shown in FIG. 4. In FIG. 5, the horizontal axis indicates an operating frequency f of the LSI serving as the integrated circuit 1, and the vertical axis indicates an impedance Zo of the decoupling capacitors corresponding to the signal of respective operating frequencies.

As shown in FIG. 5, impedance characteristics 71 of the electronic circuit using the multilayer circuit board 30 of the present embodiment exhibit a low impedance across the entire range of the operating frequency of the integrated circuit, and satisfies specifications required of the decoupling capacitors indicated by a dotted line 73 in FIG. 5. In contrast, impedance characteristics 72 of the electronic circuit formed in the multilayer circuit board 30' of the comparative example, in which lands are formed continuously on the ground layer, exceeds the required specifications 73 for any operating frequency, and thus it is clear that impedance is not sufficiently reduced.

Note that the range of the operating frequency in which the third decoupling capacitor 4 having a large capacitance exerts an influence is the frequency band indicated by the reference numeral 74 in FIG. 5, the range of operating frequency that the second decoupling capacitor 3 having a medium capacitance exerts an influence is the range indicated by the reference numeral 75 in FIG. 5, and the range of operating frequency that the first decoupling capacitor 2 having a small capacitance exerts an influence is the range indicated by the reference numeral 76 in FIG. 5. As shown in FIG. 5, it is clear that all types of the decoupling capacitors exhibit desired performance by discontinuously forming lands where the vias of the operation power-supply line on the ground layer are connected.

Note that in the above description, in FIGS. 3 and 4, in order to clearly show the ground lines 65 and 65' each serving as a return current flow path on the ground layers 33 and 33', respectively, a configuration is shown in which the vias 53b that connect the layer-3 and the layer-8 are formed near the region where the LSI is disposed. This configuration corresponds to the cross-sectional configuration shown in FIG. 2. However, as vias of the ground line that connect the layer-3 and the layer-8 each serving as a ground layer, for example, vias of the ground line of the second decoupling capacitor 3 having a medium capacitance may be used. In this case, the vias 53b that connect between the layer-3 and the layer-8 are not formed separately as shown in FIGS. 3 and 4, and a path up to the vias formed in the positions of the ground side connection terminals of the second decoupling capacitors 3 serve as the return current flow path on the ground layers 33 and 33'. Also, as vias connected to the ground side terminals of the first decoupling capacitors 2 having a small capacitance and size, vias formed in the positions of the ground side connection terminals of the second decoupling capacitors 3 may be used.

Next, as a variation of the electronic circuit of the present embodiment, a case will be described as an example in which the integrated circuit and the decoupling capacitors are disposed on the same main surface of the multilayer circuit board.

Figure 6:
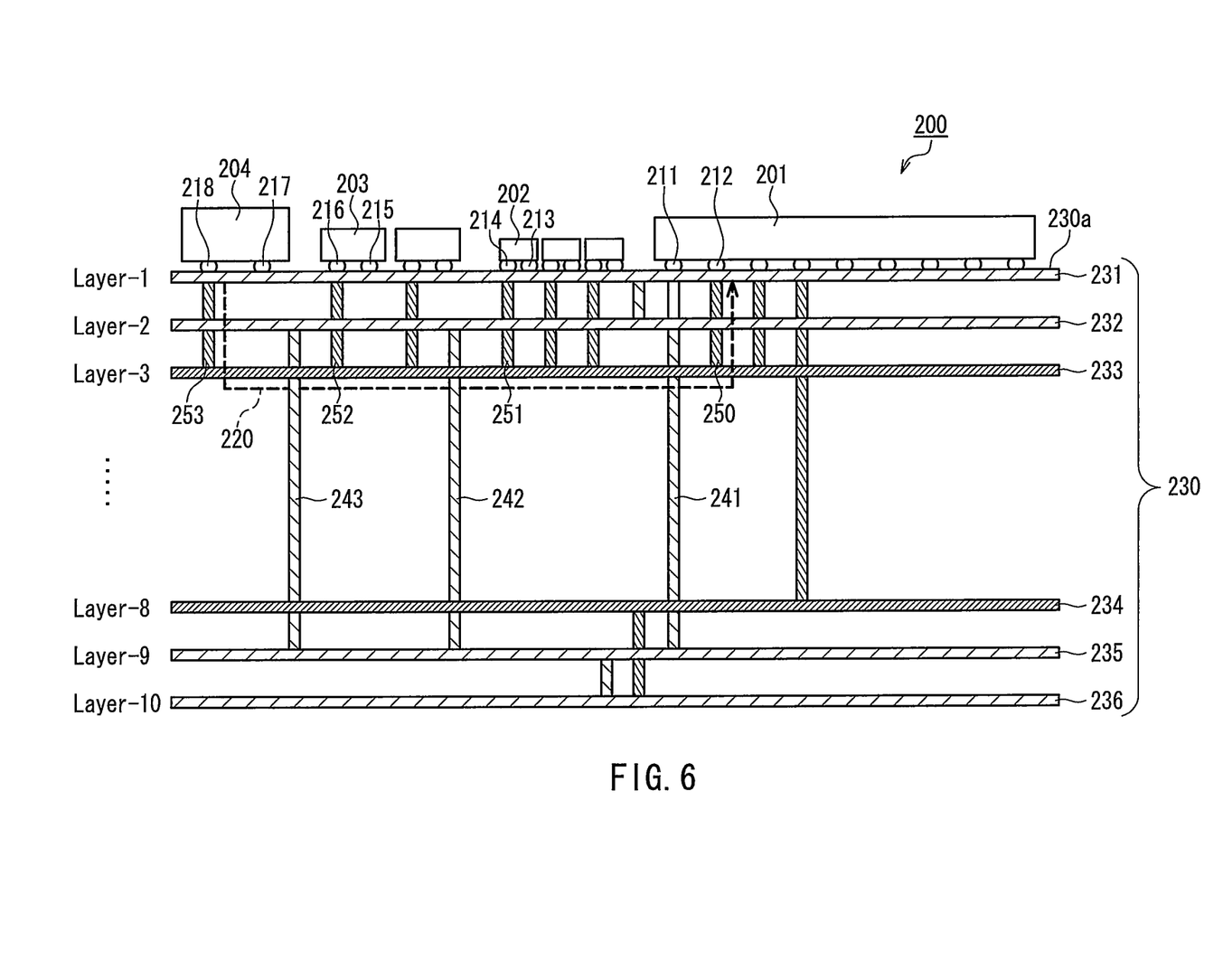
FIG. 6 is a cross-sectional circuit layout diagram illustrating a state of wiring in a multilayer circuit board of an electronic circuit of a variation of the embodiment.

FIG. 6 is a schematic diagram illustrating the state of wiring connection in a multilayer circuit board constituting an electronic circuit serving as a variation of the present embodiment. FIG. 6 corresponds to FIG. 2 illustrating an example of wiring in the multilayer circuit board of the electronic circuit of the present embodiment.

As shown in FIG. 6, a multilayer circuit board 230 constituting an electronic circuit 200 that is a variation of the present embodiment also has a ten-layer structure including layer-1 to layer-10. Also, the two layers closest to each of the main surfaces of the circuit board, that is, a layer-1 (231) and a layer-2 (232) that are close to the upper main surface in FIG. 6, and a layer-9 (235) and a layer-10 (236) that are close to the lower main surface in FIG. 6, are power layers, the entirety of each of which is basically at an operation power-supply potential (VCC). Also, the layer that is immediately inside the power layers 231 and 232, that is, a layer-3 (233) that is the third layer from the upper main surface in FIG. 6, and the layer that is immediately inside the power layers 235 and 236, that is, a layer-8 (234) that is the third layer from the lower main surface in FIG. 6, are ground layers, the entirety of each of which is basically at a ground potential (0 V). Note that although not shown in FIG. 6, the four layers (layers 4, 5, 6 and 7) in an intermediate portion, excluding the three layers from each main surface, each serves either as a signal wiring layer on which signal wiring or the like is routed in the horizontal direction or a power layer.

In this manner, the electronic circuit 200 as a variation of the present embodiment uses the multilayer circuit board 230 having a ten-layer structure, which is the same as the electronic circuit 100 of the present embodiment shown in FIG. 2. However, the configuration of the electronic circuit 200 is different from that of the electronic circuit 100 in that an integrated circuit 201 and decoupling capacitors 202, 203, and 204 are disposed and connected on one of the main surfaces of the multilayer circuit board 230, that is, on a main surface 230a on the side of the layer-1, which is on the upper side in FIG. 6.

In this manner, in the multilayer circuit board 230 of the variation, since the integrated circuit 201 and the decoupling capacitors 202, 203, and 204 are all disposed on the layer-1 (231) serving as a power layer, a power supply side connection terminal 211 of the integrated circuit 201 can be connected to power supply side connection terminals 213, 215, and 217 of the decoupling capacitors 202, 203, and 204 on a power layer 231.

In contrast, in order to connect a ground side terminal 212 of the integrated circuit 201 to ground side connection terminals 214, 216, and 218 of the decoupling capacitors 202, 203, and 204 disposed in positions separated in the horizontal direction from the integrated circuit 201, the ground line is routed to the layer-3 (233) serving as a ground layer through a via 250, then routed in the horizontal direction on the ground layer 233 and connected to the ground side connection terminals 214, 216, and 218 of the decoupling capacitors 202, 203, and 204 at the portions below the ground side connection terminals of the decoupling capacitors 202, 203, and 204, through the power layers 231 and 232 with vias 251, 252 and 253.

In this manner, in the electronic circuit 200 of the variation, vias connected to the ground layer 233 are formed on the power layer 231, and the operation power-supply line is connected on the surface of the power layer 231 while avoiding these vias. At this time, if the vias 251, 252 and 253 for connecting to the ground layer 233 are connected by forming a large land in order to reduce the electric resistance, the length of the operation power-supply line that needs to be routed in the horizontal direction on the power layer 231 is unnecessarily increased. For this reason, in the electronic circuit 200 of the variation, lands formed on the power layer 231 and that each collect a plurality of vias constituting the ground line are formed discontinuously at a predetermined interval, with a gap having a predetermined width provided between the lands. By forming the lands of the ground line discontinuously in this manner, the gap between the lands serves as the current flow path of the operation power-supply line, and thus it is possible to prevent frequency characteristics of the decoupling capacitors from deteriorating.

As described above, in the electronic circuit of the present embodiment, planar lands formed on the power layer and each collecting a plurality of vias constituting the ground line, or planar lands formed on the ground layer and each collecting a plurality of vias constituting the operation power-supply line are formed discontinuously at a predetermined interval with a gap having a predetermined width provided between the lands. As a result, the gap portion between the lands serves as a current flow path, and thereby impedance of the decoupling capacitors can be effectively reduced.

Accordingly, in the electronic circuit of the present embodiment, impedance of the decoupling capacitors can be set to a desired value across the entire range of the operating frequency of the integrated circuit, so that noise applied to the power-supply voltage in the range of the operating frequency or fluctuation in the operation power-supply voltage can be removed reliably. As a result, an electronic circuit including an integrated circuit that operates at a high speed and a high current, and having a high operation reliability can be realized.

Note that in the above-described embodiment, a configuration is described in which the multilayer circuit board has a ten-layer structure in which two layers from each of the surfaces thereof serve as power layers, and one layer immediately inside each set of two layers serves as a ground layer. However, this is merely an example, and the configuration of the multilayer circuit board of the present embodiment is not limited to this. The layout and the number of the power layers and the ground layers, and the total number of layers including signal wiring layers appropriately can be designed in a range required for an electronic circuit.

Also, in the present embodiment, a case is described in which the ground line that connects the terminals of the integrated circuit to the terminals of the decoupling capacitors is routed in the horizontal direction on the ground layer, namely, the layer-3. However, the wiring structure in the multilayer circuit board of the electronic circuit of the present embodiment is not limited to this, and a configuration may be adopted in which the operation power-supply line is routed in the horizontal direction on one or a plurality of power layers, and the ground line is routed in the horizontal direction on one or two or more ground layers. In any of these cases, by disposing lands discontinuously such that the current flow path for connecting the integrated circuit and the decoupling capacitors is not interrupted by the lands each formed by collecting a plurality of vias, a desired effect can be achieved.

The electronic circuit disclosed in the present invention can be used as a key component for various electronic and information devices, as an electronic circuit that includes an integrated circuit that has a wide operating frequency range and to which a high current is applied, and that is capable of operating stably without being affected by noise or fluctuation in the operation power-supply voltage using the decoupling capacitors.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. An electronic circuit comprising:
    an integrated circuit;
    a plurality of decoupling capacitors; and
    a multilayer circuit board on which the integrated circuit and the plurality of decoupling capacitors are mounted, the multilayer circuit board having a power layer and the ground layer,
    wherein a plurality of planar lands are formed on one or both of the power layer and the ground layer, each of the lands having densely disposed therein a plurality of via holes that connect terminals of the integrated circuit and corresponding terminals of the decoupling capacitors respectively,
    each of the lands formed on the power layer or the ground layer is discontinuously disposed at a predetermined interval with a gap having a predetermined width provided therebetween, and
    each of the lands is connected to one of the plurality decoupling capacitors in one-to-one correspondence.

2. The electronic circuit according to claim 1, wherein each of the lands is disposed discontinuously for each of the terminals of the respective decoupling capacitors to which each of the lands corresponds, with the predetermined gap provided therebetween.

* * * * *